United States Patent [19]
Kosinski

[11] Patent Number: 5,939,815
[45] Date of Patent: Aug. 17, 1999

[54] FIELD TRAPPING ELECTRODES

[75] Inventor: John A. Kosinski, Wall, N.J.

[73] Assignee: The United States of America as represented by the Secretary of the Army, Washington, D.C.

[21] Appl. No.: 08/899,027

[22] Filed: Jul. 23, 1997

[51] Int. Cl.[6] .................................................. H01L 41/08
[52] U.S. Cl. ........................ 310/318; 310/366; 310/369
[58] Field of Search .................................. 310/318, 320, 310/366, 369

[56] References Cited

U.S. PATENT DOCUMENTS

| | | | |
|---|---|---|---|
| 2,969,512 | 1/1961 | Jaffe et al. | 310/366 X |
| 3,465,178 | 9/1969 | Pardue | 310/366 |
| 3,495,105 | 2/1970 | Shimano | 310/366 |
| 4,184,095 | 1/1980 | Stacchiotti | 310/366 |
| 4,376,919 | 3/1983 | Konno et al. | 310/366 X |
| 4,529,904 | 7/1985 | Hattersley | 310/318 |
| 4,870,313 | 9/1989 | Hirama et al. | 310/366 X |
| 5,757,104 | 5/1998 | Getman et al. | 310/366 X |

FOREIGN PATENT DOCUMENTS

| | | | |
|---|---|---|---|
| 0079316 | 4/1986 | Japan | 310/366 |

*Primary Examiner*—Mark O. Budd
*Attorney, Agent, or Firm*—Michael Zelenka; John M. O'Meara

[57] ABSTRACT

Piezoelectric resonator structures and circuits therefor are provided to trap the energy available for vibrational deformation in a resonator, between the driving electrodes of the resonator structure. Field trapping electrodes are disposed to enclosed the driving electrodes in the resonator structures which are arranged in circuits to derive electric fields between the field trapping electrodes in an opposite direction to that of an electric field between the driving electrodes.

6 Claims, 3 Drawing Sheets

FIG. 1 _Prior Art_
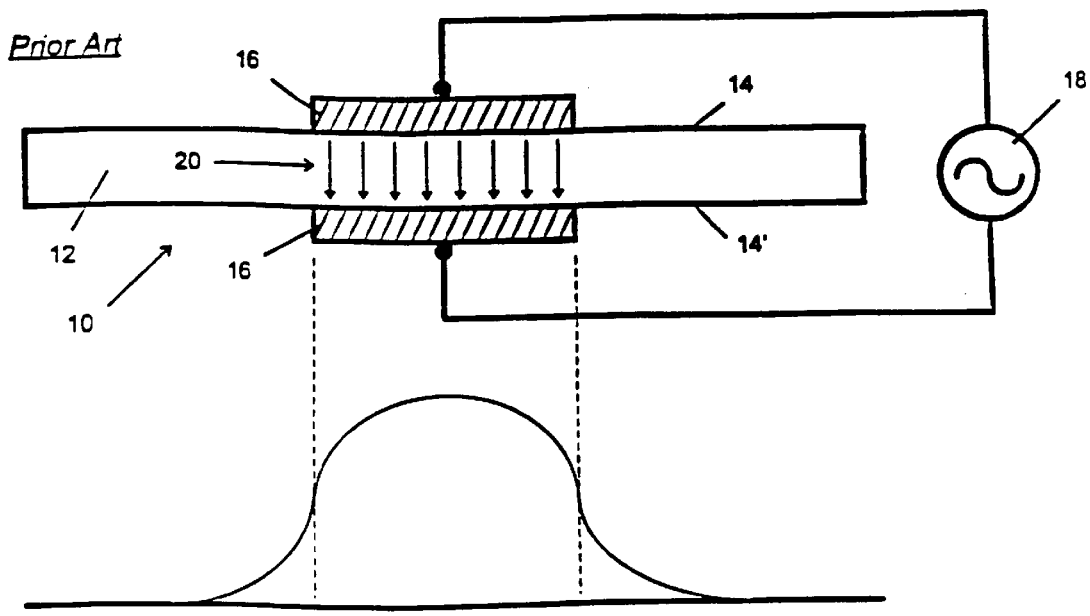
FIG. 2
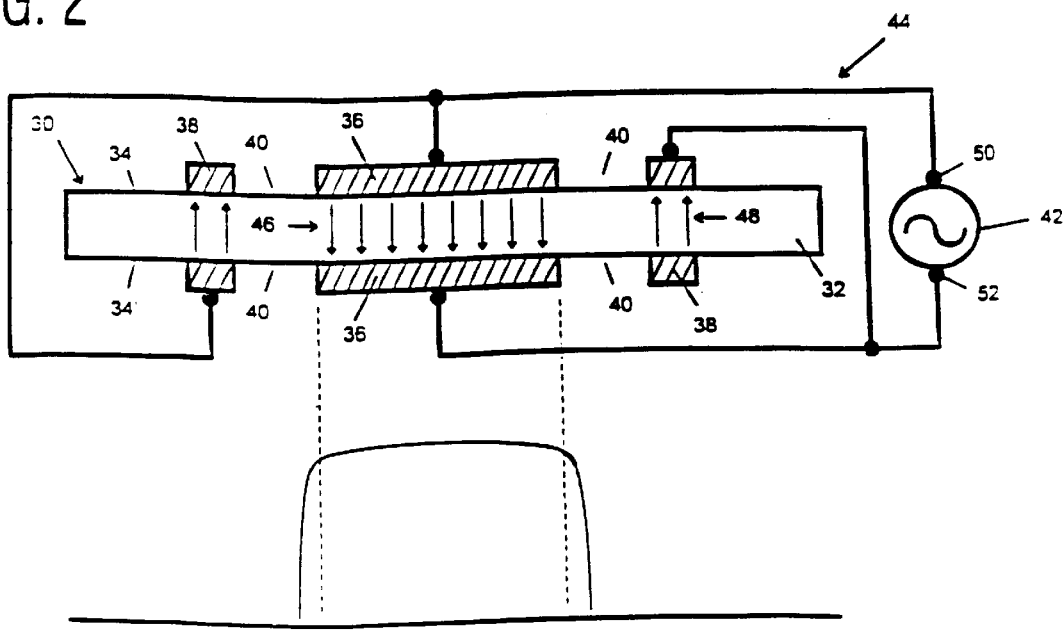

FIELD TRAPPING ELECTRODES

GOVERNMENT INTEREST

The invention described herein may be manufactured, used, and licensed by or for the United States Government for governmental purposes without payment to me of any royalties thereon.

BACKGROUND OF THE INVENTION

The present invention relates to piezoelectric resonators, particularly such resonators wherein energy trapping is implemented to reduce or eliminate spurious responses which result from interaction of an intended vibrational deformation in a portion of the piezoelectric arrangement with other portions of that arrangement.

A well known type of resonator structure includes a piezoelectric substrate having driving electrodes disposed on opposite surfaces thereof. When an AC source is applied across the electrodes, the substrate vibrates in accordance with the frequency of the AC source, as well as the piezoelectric and vibrational characteristics of the substrate. When the substrate surfaces extend beyond the electrodes, the extending portions thereof will tend to vibrate along with the portion thereof disposed between the electrodes. Because any vibrational deformation in those extending portions causes spurious responses from the resonator, energy trapping measures are usually taken to reduce or eliminate vibrational deformation in those portions. Such measures include techniques known as mass loading and contouring by which the natural frequencies of the extending portions and the portion between the electrodes are made to be different, so that vibrational deformation in the former will be reduced or eliminated when vibrational deformation occurs in the latter.

SUMMARY OF THE INVENTION

It is the general object of the present invention to accomplish energy trapping in piezoelectric resonators through the use of at least one pair of field trapping electrodes.

It is the specific object of the present invention to focus energy in piezoelectric resonators by connecting the field trapping electrodes of the general object in circuitry arranged to derive fields between those electrodes in opposition to the conventional field which drives the resonator.

These and other objects are accomplished in accordance with the present invention, by disposing field trapping electrodes on the opposite surfaces of the piezoelectric substrate which extend beyond the driving electrodes. On each surface, the field trapping electrodes enclose the driving electrodes and gaps exist therebetween on the surfaces. When operating the resonator, the AC source is connected therewith in a circuit arrangement that activates the driving and the field trapping electrodes to derive counter fields across the substrate which results in the vibrational deformation being focused between the driving electrodes. In one embodiment, the field energy between the trapping electrodes is made equal to the energy which passes from the driving electrodes to the extending portions of the substrate, by controlling the width of the field trapping electrodes. This equalization of energy is accomplished in other embodiments by controlling either the relative magnitude or phase of the voltages applied across the driving and field trapping electrodes.

The scope of the present invention is only limited by the appended claims for which support is predicated on the preferred embodiments hereafter set forth in the following description and the attached drawings.

DESCRIPTION OF THE DRAWINGS

FIG. 1 is a side view of one prior art piezoelectric resonator which includes a schematic diagram relating to the operation thereof and also illustrates the distribution of vibrational deformation encountered when the resonator is operated;

FIG. 2 is a side view of one piezoelectric resonator in accordance with the invention which includes a schematic diagram relating to the operation thereof and also illustrates the distribution of vibrational deformation encountered when the resonator is operated;

DESCRIPTION OF THE PREFERRED EMBODIMENTS

Figure 3:
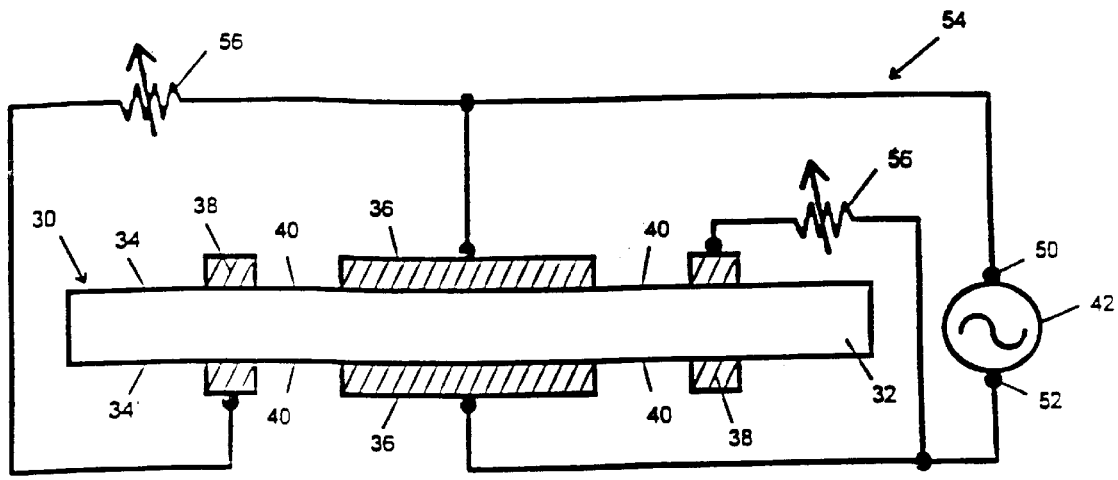
FIG. 3 is another schematic diagram relating to the operation of the FIG. 2 resonator.

A resonator structure 10 of conventional design is shown in FIG. 1. Structure 10 includes a piezoelectric substrate 12 having first and second planar surfaces 14 and 14' respectively, disposed on opposite sides thereof. Each of the surfaces 14 and 14' has a driving electrode 16 disposed thereon and these electrodes 16 are in superposed alignment across the substrate 12. The driving electrodes 16 are usually configured as circular disks however, other configurations are possible therefor.

When operated, structure 10 is connected across its electrodes 16 to an AC source 18, which causes its substrate 12 to vibrate as the result of an alternating electric field 20 being sustained therein. The amplitude of the vibration in the portion of the substrate 12 between the electrodes 16, varies as a function of distance from the center of (or the width across) those electrodes, as shown in FIG. 1. Of course, those portions of the substrate 12 that extend out from or beyond the electrodes 16 will also vibrate but with lesser amplitude than encountered by the substrate portion between those electrodes, as also shown in FIG. 1.

As shown in FIG. 2, the present invention relates to a resonator structure 30 which includes a piezoelectric substrate 32 having first and second planar surfaces 34 and 34' respectively, on opposite sides thereof. A pair of driving electrodes 36 are disposed on the surfaces 34 and 34' in superposed alignment across the substrate 32. At least one pair of field trapping electrodes 38 are also disposed on the surfaces 34 and 34', in superposed alignment across the substrate 32. Electrodes 38 are configured to enclose the driving electrode 36 on each surface 34 and 34', with a surface gap 40 existing therebetween. In FIG. 2, the driving electrodes 36 are configured as circular disks while the field trapping electrodes 38 are configured as circular rings however, other compatible configurations are possible for the electrodes 36 and 38.

When operated, resonator structure 30 is arranged with an AC source 42 in a circuit 44, to sustain alternating electric fields 46 and 48 in opposite directions between the driving electrodes 36 and the field trapping electrodes 38 respectively. The frequency of the fields 46 and 48, the piezoelectric characteristics of the substrate 32 and the relative locations of the electrodes 36 and 38 on the substrate 32, all must be considered to accomplish the general object of the invention. In the FIG. 2 embodiment of the circuit 44, source 42 includes first and second output terminals 50 and 52 respectively, across which the pair of driving electrodes 36 and each pair of field trapping electrodes 38 are connected in parallel. To implement this parallel arrangement, the driving electrode 36 on surface 34 and each field trapping electrode 38 on surface 34' connect to terminal 50 while each field trapping electrode 38 on surface 34 and the driving electrode 36 on surface 34' connect to terminal 52. As shown in FIG. 2, circuit 44 functions to essentially trap the energy available for vibrational deformation in the substrate 32, between the driving electrodes 36. Consequently, resonator signal responses that result from vibrational deformation in portions of the substrate 32 other than the portion between the driving electrodes 36, are reduced or eliminated. As discussed below, other circuit arrangements are also possible to trap the energy available for vibrational deformation within the portion of the substrate 32 between the driving electrodes 36.

A circuit 54 is shown in FIG. 3, which modifies the arrangement of circuit 44 in FIG. 2 by controlling the voltage magnitude applied at the field trapping electrodes 38 on surfaces 34 and 34', relative to the voltage magnitude applied at the driving electrode 36 on surfaces 34' and 34 respectively. To accomplish this, a variable resistance 56 is connected between each field trapping electrodes 38 and the output terminal 50 or 52 to which that electrode 38 connects directly in FIG. 2. Otherwise, the resonator structure 30 in circuit 54 is the same as the resonator structure 30 in circuit 44.

Figure 4:
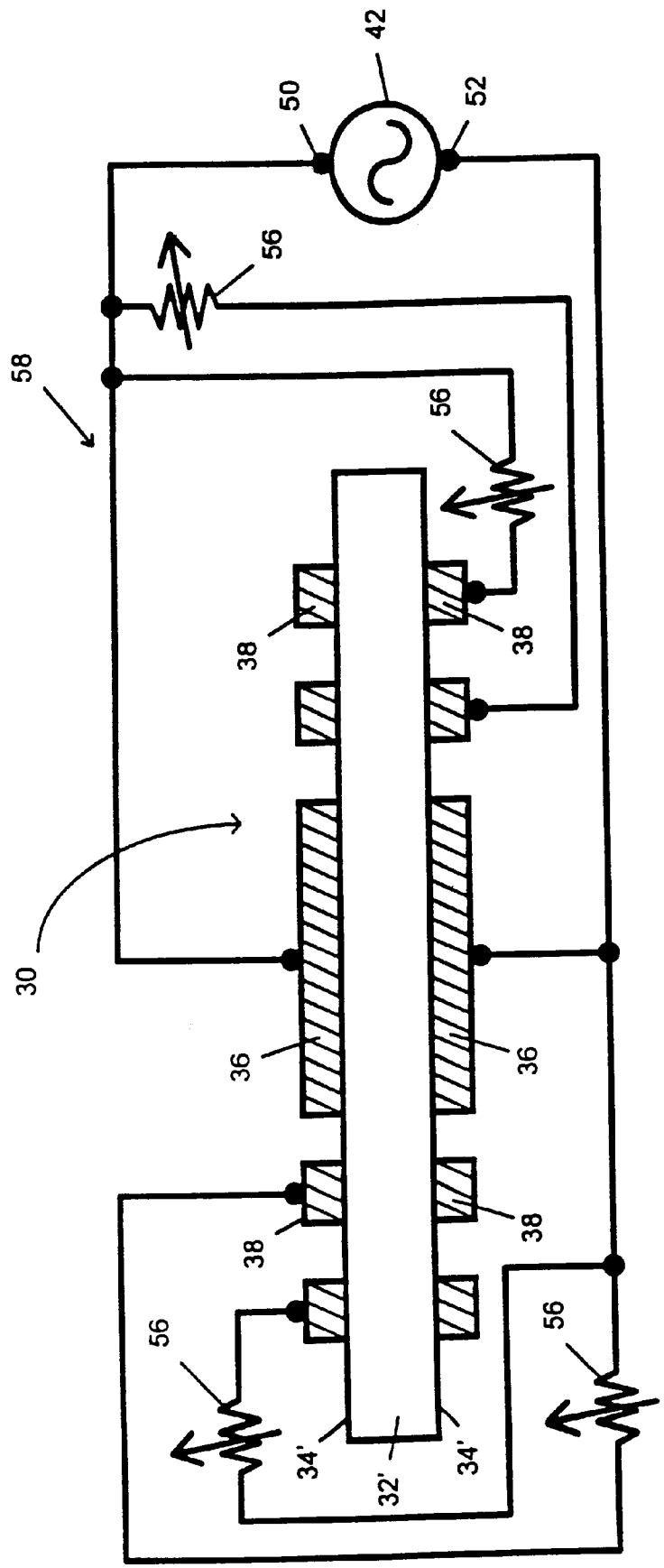
FIG. 4 is a side view of another piezoelectric resonator in accordance with the invention and includes a schematic diagram relating to the operation thereof.

FIG. 4 illustrates a circuit 58 which modifies the arrangement of circuit 54 in FIG. 3 by including at least two pairs of field trapping electrodes 38' on the substrate 32' in the resonator structure 30'. The voltage magnitude applied at the field trapping electrodes 38' on surfaces 34 and 34', is controlled relative to the voltage magnitude applied at the driving electrodes 36 on surfaces 34' and 34 respectively, by connecting one variable resistance 56' between each field trapping electrode 38' and the output terminal 50 or 52 relating to that electrode 38'.

Figure 5:
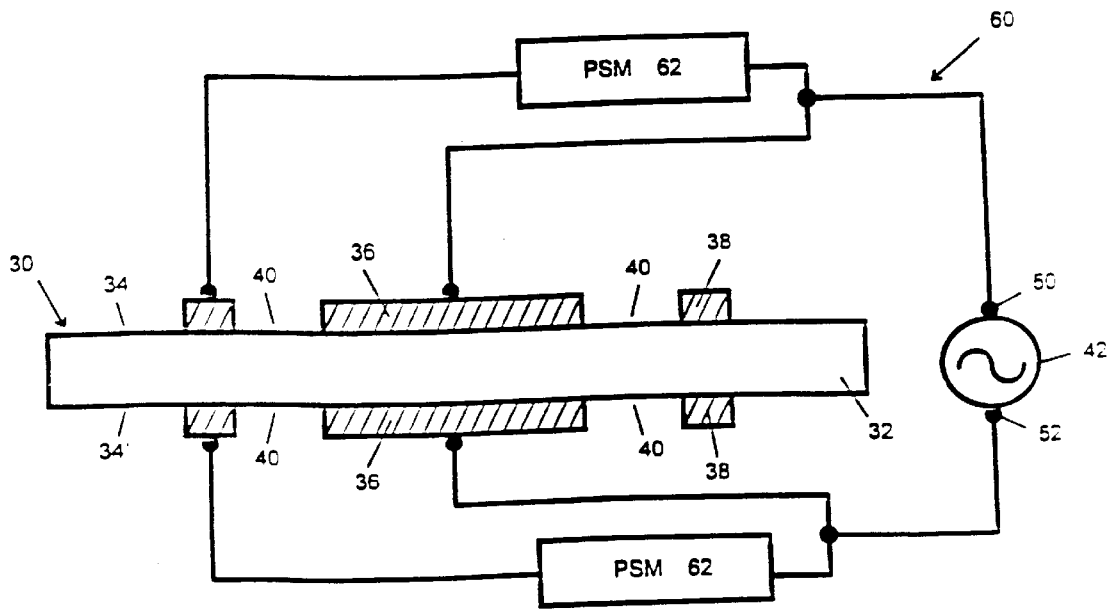
FIG. 5 is another schematic diagram relating to the operation of the FIG. 2 resonator.

Another circuit 60 is shown in FIG. 5 wherein the phase between the voltage applied at each field trapping electrode 38 and the voltage applied at the driving electrode 36 on the same surface 34 or 34' with that electrode 38, is controlled. Each output terminal 50 or 52 connects to the electrodes 36 and 38 on one of the surfaces 34 and 34', with either the electrode 36 or the electrodes 38 on that surface being connected through a means 62 for shifting the phase of the applied voltage.

Those skilled in the art will appreciate without any further explanation that within the concept of this invention many modifications and variations are possible to the above disclosed embodiments of the resonator structure 30 and implementing circuitry therefor. Consequently, it should be understood that all such variations and modifications fall within the scope of the following claims.

What is claimed is:

1. A resonator structure arranged in a circuit, comprising:
   a piezoelectric substrate having first and second planar surfaces disposed on opposite sides thereof;
   a pair of driving electrodes disposed on the surfaces in superposed alignment across the substrate;
   at least one pair of field trapping electrodes disposed on the surfaces with the electrodes of each pair being in superposed alignment across the substrate and being configured to enclose the driving electrodes on the surfaces; and
   an AC source including first and second output terminals which are connected across the driving electrodes and across each pair of field trapping electrodes, with the driving electrode on the first substrate surface and the field trapping electrodes on the second substrate surface connected to the first output terminal while the field trapping electrodes on the first substrate surface and the driving electrode on the second substrate surface are connected to the second output terminal, so as to derive electric fields between the field trapping electrodes in an opposite direction to that of an electric field between the driving electrodes.

2. The resonator structure of claim 1 wherein each driving electrode is configured as a circular disk, while each field trapping electrode is configured as a circular ring.

3. The circuit arrangement of claim 1 wherein a variable resistance is connected between each output terminal and the field trapping electrodes connecting to that output terminal, for controlling the voltage magnitude applied across the field trapping electrodes to thereby limit vibrational deformation in the substrate to the portion thereof disposed between the driving electrodes.

4. The circuit arrangement of claim 1 wherein at least two pair of field trapping electrodes are disposed in the resonator structure and a variable resistance is connected between each output terminal and each field trapping electrode connecting to that output terminal, for controlling the voltage magnitude applied across the field trapping electrodes to thereby limit vibrational deformation in the substrate to the portion thereof disposed between the driving electrodes.

5. The circuit arrangement of claim 1 wherein a phase shifting means is connected between each output and the field trapping electrodes connecting to that output terminal, for controlling the phase of the voltage applied across the field trapping electrodes to thereby limit vibrational deformation in the substrate to the portion thereof disposed between the driving electrodes.

6. The circuit arrangement of claim 1 wherein at least two pair of field trapping electrodes are disposed in the resonator structure and a phase shifting means is connected between each output terminal and each field trapping electrode connecting to that output terminal, for controlling the phase of the voltage applied across the field trapping electrodes to thereby limit vibrational deformation in the substrate to the portion thereof disposed between the driving electrodes.

* * * * *